(12) United States Patent
Ryoo (10) Patent No.: US 6,751,158 B2
(45) Date of Patent: Jun. 15, 2004

(54) BIT COUNTER, AND PROGRAM CIRCUIT IN SEMICONDUCTOR DEVICE AND METHOD OF PROGRAMMING USING THE SAME

(75) Inventor: Pil Sang Ryoo, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/320,521

(22) Filed: Dec. 17, 2002

(65) Prior Publication Data

US 2004/0013026 A1 Jan. 22, 2004

(30) Foreign Application Priority Data

Jul. 18, 2002 (KR) ................. 10-2002-0042172

(51) Int. Cl.[7] .................................. G11C 7/00
(52) U.S. Cl. ................. 365/233; 365/194; 365/236
(58) Field of Search ................. 365/233, 194, 365/236, 239

(56) References Cited

U.S. PATENT DOCUMENTS 6,128,248 A * 10/2000 Idei et al. .................... 365/233
6,552,956 B2 * 4/2003 Shibata ........................ 365/233

* cited by examiner

*Primary Examiner*—Vu A. Le
(74) *Attorney, Agent, or Firm*—Morgan, Lewis & Bockius LLP (57) ABSTRACT

The present invention relates to a bit counter, and a program circuit of a semiconductor device and a program method using the same. Upon a program operation of a word unit, only program data to be programmed among the program data are counted within a pumping period using the bit counter for counting bits of program data. Then, if the number of the bits of the data to be programmed is less than 8, a program operation is performed at a time. Accordingly, a program operation time can be shorten.

14 Claims, 7 Drawing Sheets

BIT COUNTER, AND PROGRAM CIRCUIT IN SEMICONDUCTOR DEVICE AND METHOD OF PROGRAMMING USING THE SAME

BACKGROUND OF THE INVENTION

1. Field of the Invention

The invention relates generally to a bit counter, and a program circuit in a semiconductor device and a method of programming the semiconductor device using the same. More particularly, the invention relates to a bit counter capable of reducing a program operation time upon the program operation, and a program circuit in a nonvolatile memory device including EEROM (electrically erasable and programmable read only memory) series and a method of programming the semiconductor device using the same.

2. Description of the Prior Art

In a memory cell of EEPROM (electrically erasable and programmable read-only memory) being a kind of a nonvolatile semiconductor device, a program operation is performed in which electrons are accumulated at a floating gate electrode. A read operation for data is performed by detecting variation in the threshold voltage depending on existence of the electrons. The EEPROM includes a flash EEPROM (hereinafter, called 'flash memory device') in which an erase operation of data is performed for the entire memory cell array or the erase operation of data is performed for the memory cell array in a block unit by dividing the memory cell array into given blocks.

Generally, the memory cells of the flash memory device can be classified in to a stack gate type and a split gate type, depending on its structure. The program operation of the stack gate type memory cell is mainly divided into a program step and a program-verify step. Biases at each of the steps is indicated in Table 1 below.

TABLE 1

| Step | Program Step | Program-Verify Step |
|---|---|---|
| Gate Voltage | 9 V | 6 V |
| Drain Voltage | 4 V | 1 V |
| Source Voltage | 0 V | 0 V |

Generally, the program operation is one by which the threshold voltage of the memory cell in the flash memory device is increased to a target threshold voltage. In the program step, the threshold voltage of a corresponding memory cell is increased by injecting electrons into the floating gate electrode through injection of hot carriers. In the program-verify step, the program operation is stopped at an adequate level by sensing variation in the amount of the target threshold voltage during the program step.

Figure 6:
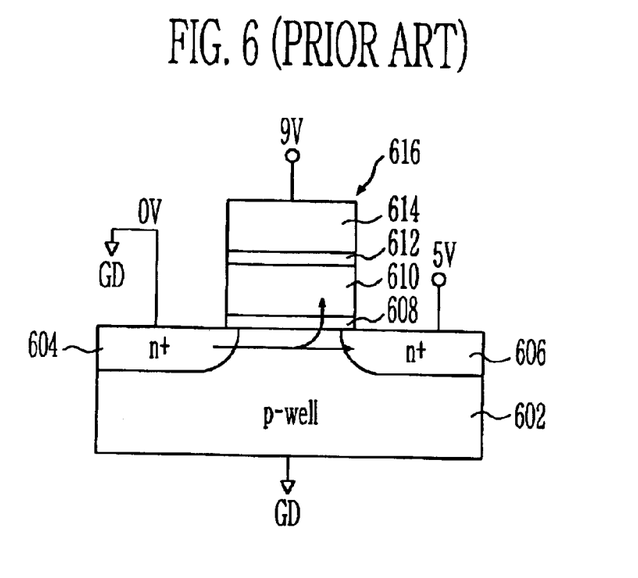
FIG. 6 is a cross sectional view of a memory cell for explaining a program step of a common flash memory device.
Figure 7:
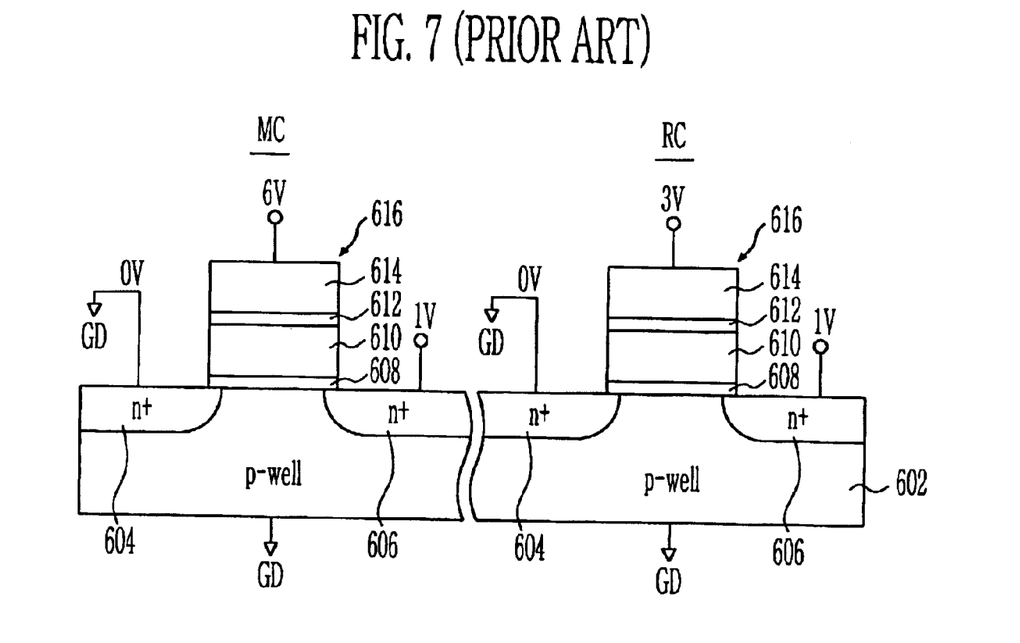
FIG. 7 is a cross sectional view of a memory cell for explaining a program-verify step of a common flash memory device.

Based on Table 1, the program operation of the memory cell in the flash memory device will be described by reference to FIG. 6 and FIG. 7. At this time, FIG. 6 is a cross sectional view of the memory cell for explaining the program step of the flash memory device and FIG. 7 is a cross sectional view of the memory cell for explaining the program-verify step of the flash memory device. Meanwhile, the gate electrode of a stack structure shown in FIG. 6 and FIG. 7 includes a gate oxide film 608, a floating gate electrode 610, a dielectric film 612 and a control gate electrode 614. The semiconductor substrate 602 includes a P-well, a source 604 and a drain 606

Referring now to FIG. 6, in the program step of the program operation, a gate voltage of 9V is applied to the control gate electrode 614, a drain voltage of 4V is applied to the drain 606, and 0V (ground; GD) is applied to the source 604 and the P-well, as indicated in Table 1. Thereby, as shown by an arrow direction, the hot carriers are moved from the source 604 to the drain 606 and the floating gate electrode 610. The electrons are thus injected into the floating gate electrode 610, so that the threshold voltage of the memory cell is increased.

By reference to FIG. 7, in the state that the electrons are injected into the floating gate electrode 610 through the program step in FIG. 6, if it is determined that the threshold voltage reaches a target value by sensing real time the threshold voltage of the memory cell, a program-verify step is performed by applying the gate voltage of 6V to the control gate electrode 114 of the main cell (MC), the drain voltage of 1V to the drain, the gate voltage of 3V to the control gate electrode 614 of a reference cell (RC) and the drain voltage of 1V to the drain. At this time, the program-verify step may be changed depending on the bias condition of the reference cell (RC) connected to the main cell (MC) and the sense amplifier.

The entire program operation is repeatedly performed for the entire memory cells. An example of this will be below described by reference to the flowchart shown in FIG. 8.

Figure 8:
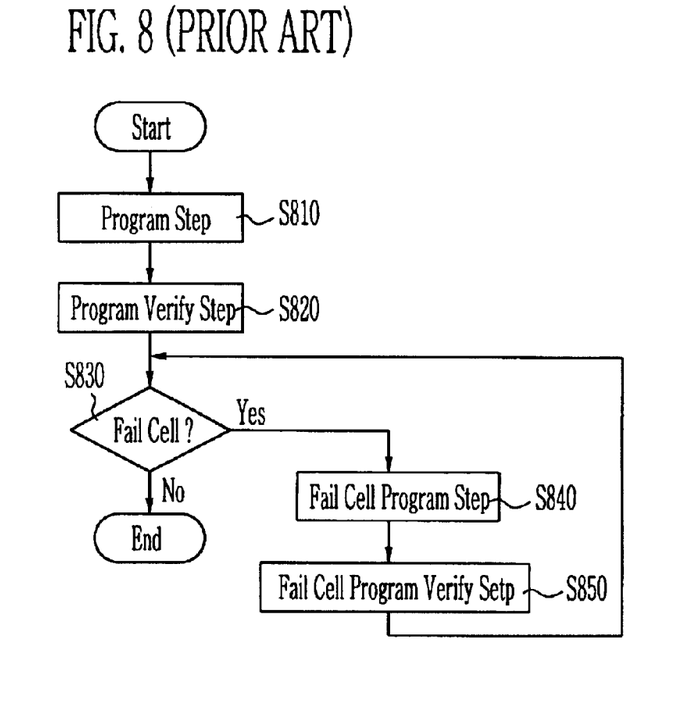
FIG. 8 is a flowchart for explaining the entire program operation of the common flash memory cell.

For example, the program operation may be performed for the entire memory cells in a word unit (i.e., 16 bits). In this case, the program step and the program-verify step are first performed for all corresponding memory cells including in the word unit (S810 and S820). Next, it is determined whether there exist failed memory cells of the corresponding memory cells included in the word unit, in the program step and the program-verify step (S830). As a result of determination, if it is determined that failed cells exist in the step (S830), the program step and the program-verify step are performed for the failed cells (S840 and S850). These processes are repeatedly performed until failed memory cells do not exist.

Generally, in case that the program operation is performed in the word unit, the program current flowing from the drain to the source is very high. In order to increase the program efficiency and to reduce the operating current of the drain pump, the program operation is internally performed in a byte unit. In other words, upon the program operation of the byte unit, the program step is first performed for the I/O (input/output)<7:0>(i.e., 8 bits) and the program step is then performed for a next I/O<15:8>(i.e., 8 bits). Next, the program-verify step is performed for the I/O<15:0>(i.e., 16 bits) at a time. If there occurred any fail, the above processes are repeatedly performed. If any fail does not exist, the program operation is finished.

Figure 9:
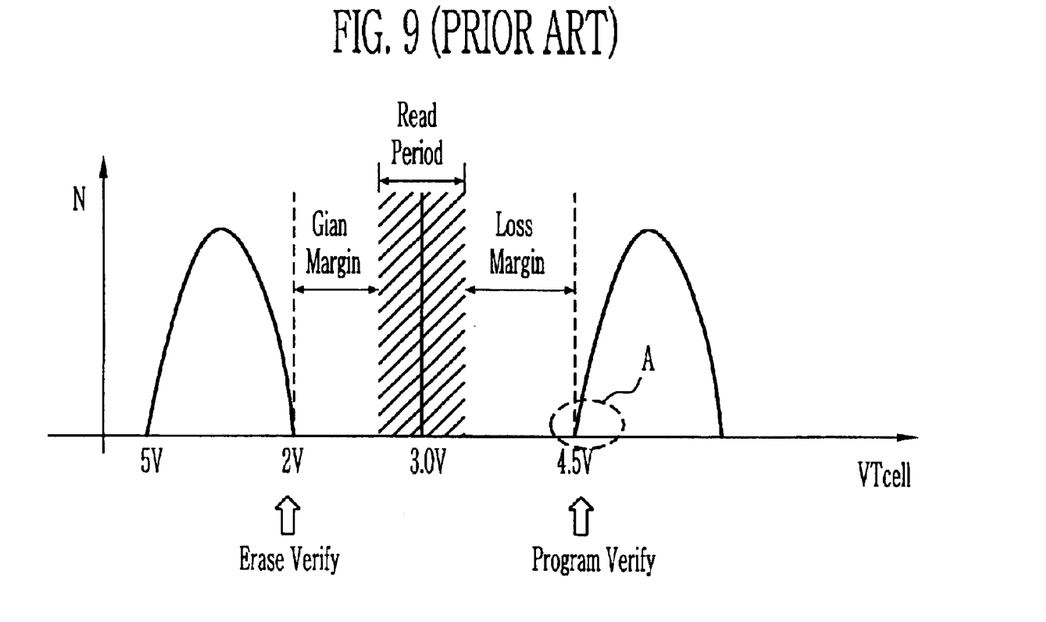
FIG. 9 is a graph showing distribution of the memory cells per line in the common flash memory device.

However, as shown in distribution of the entire memory cells shown in FIG. 9, upon the program operation, there exist marginal cells (that is, cells corresponding to the cut line in the pass) at an 'A' portion (point where the threshold voltage of the cell is 4.5V). In this state, if the program-verify step is performed, there may occur a case that the marginal cells are again determined to be a fail depending on the margin of the bias, even though they were determined to be passed.

As described above, if the program operation is repeatedly performed since the failed cells exist, a program pulse is always applied twice every 8 bit even though there exist passed bits among the 16 cells. In other words, assuming that the program time is 5 μs, the program time is increased by an integer times every time when the failed cells occur '5×2=10 μs'. Therefore, it causes to not only give a burden to the pumping circuit for supplying the bias upon the program operation but also increase the total time of the program operation. Further, there is a problem that the retention capability of data is degraded due to over-program since the bias is repeatedly applied to the already-programmed cells,

SUMMARY OF THE INVENTION

The present invention is contrived to solve the above problems and an object of the present invention is to provide a bit counter capable of reducing a program operation time upon the program operation.

Another object of the present invention is to provide a program circuit of a semiconductor device using the bit counter.

Still another object of the present invention is to provide a method of programming the semiconductor device using the bit counter.

In order to accomplish the above object, the bit counter according to the present invention, is characterized in that it comprises a plurality of clock generators corresponding to program data inputted, wherein the clock generators are synchronized to the program data to be programmed, among the program data, to generate different clock signals, and a counter synchronized to the clock signals outputted from the clock generators and sequentially shifting the input data, upon synchronization, to count the number of bits of the program data to be programmed among the program data.

Also, the program circuit according to the present invention is characterized in that it comprises I/O terminals for transmitting program data, the bit counter written in the previous paragraph, for counting the number of bits of the program data to be programmed, among the program data transmitted from the I/O terminals, and a state machine for selecting a program operation in a word unit or in a byte unit to perform the program operation, depending on the number of the bits counted by the bit counter.

Further, the program method using the program circuit comprises the steps of setting up program data and address and then inputting a program command, in order to perform a program operation, counting the number of bits of the program data to be programmed, among the program data, within a pumping period where a program voltage is pumped, in order to perform the program operation, and performing the program operation by selecting the program operation in a word unit or a byte unit, depending on the number of the bit counted in the previous step.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 1:
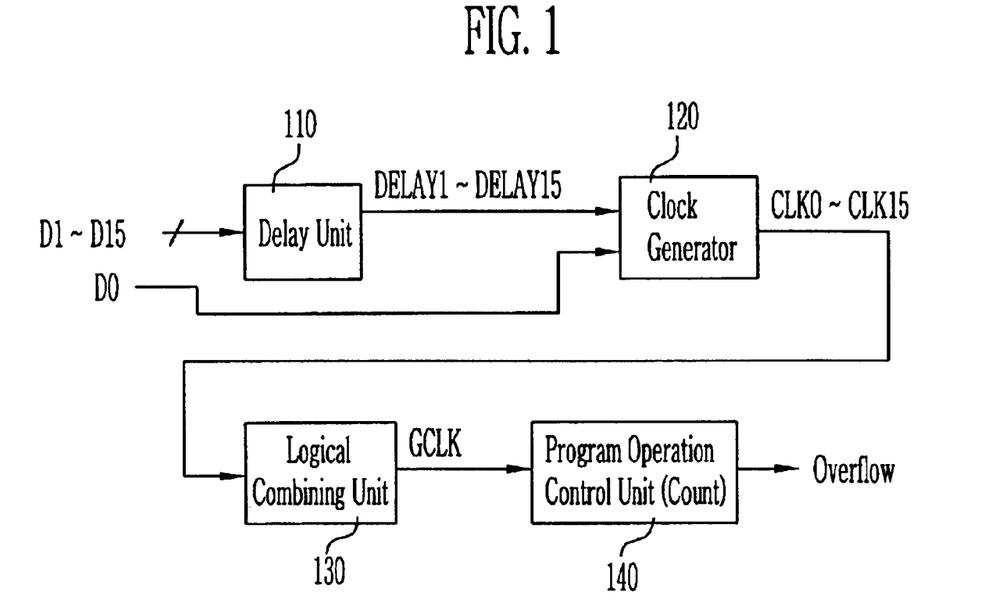
FIG. 1 is a block diagram of a bit counter according to a preferred embodiment of the present invention.
Figure 2:
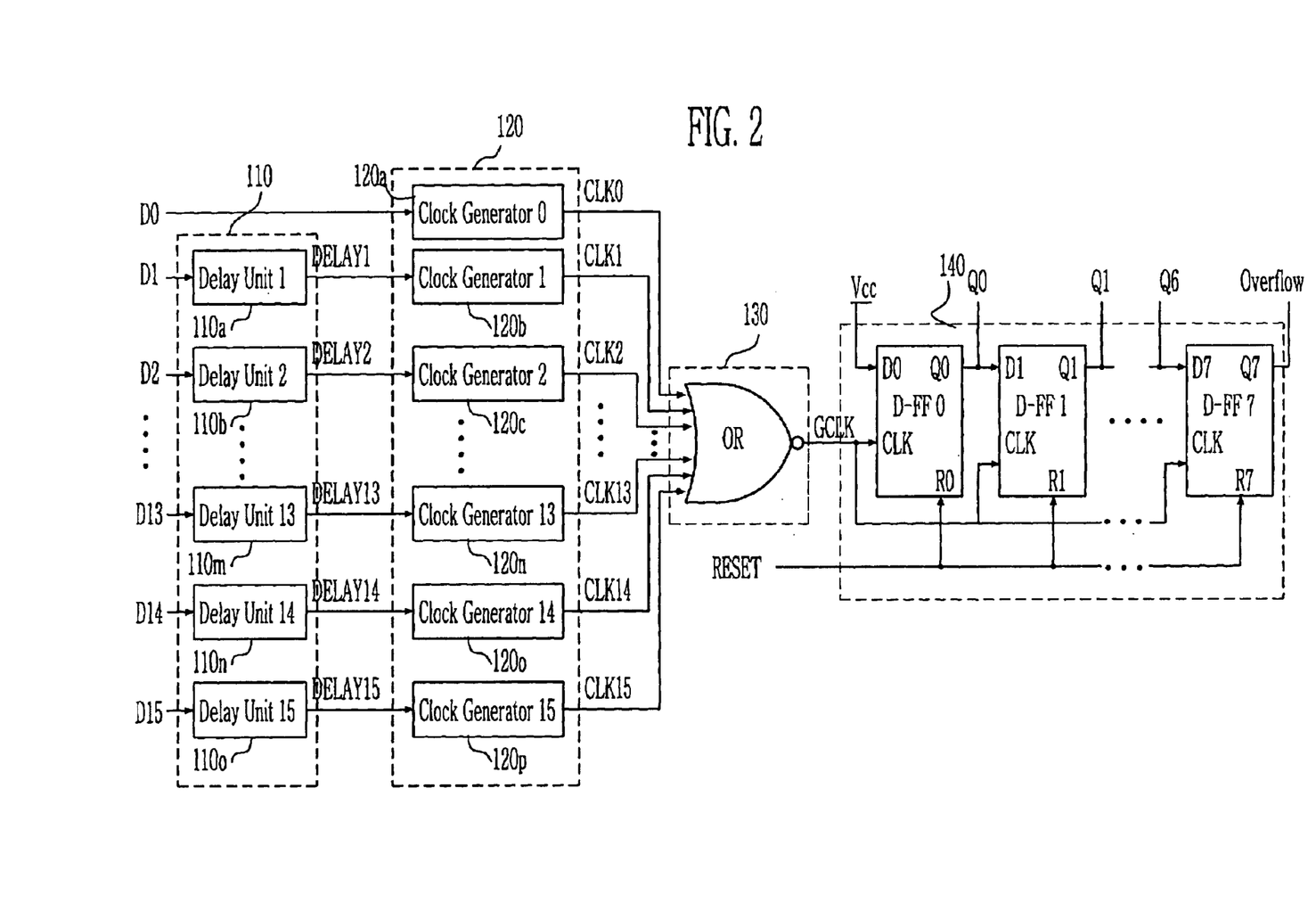
FIG. 2 is a detailed circuit diagram of the bit counter shown in FIG. 1.

FIG. 1 is a block diagram of a bit counter according to one preferred embodiment of the present invention and FIG. 2 is a detailed circuit diagram of the bit counter shown in FIG. 1.

Referring now to FIG. 1 and FIG. 2, the bit counter according to the present invention includes a delay unit 110, a clock generator 120, a logical combining unit 130 and a counter; 140. Meanwhile, program data signals (D0 through D15, <15:0>), that will be described below, are transmitted form an I/O terminal (not shown). In general, if states of the program data signals is a Low state (0), a program operation is performed. If they are a High state (1), the program operation is not performed.

The delay unit 110 includes a plurality of delay units, for example, fifteen delay units 110a through 110o, which are one to one corresponding to the inputted program data signals (D1 through D15). A program data signal (D0) is omitted from the above since it is not required to be delayed. Each of the delay units 110a through 110o delays the program data signals (D1 through D15), respectively, which are transmitted from the I/O terminals, by approximately one (1) clock. This is for the clock signals (CLK0 through CLK15) generated from a plurality (for example sixteen) of clock generators 120a through 120p included in the clock generator 120 not to be overlapped. For this, the delay units 110a through 110o output the delay signals (DELAY1 through DELAY15) that are delayed by the integer time, respectively. For example, the clock of each of the delay signals (DELAY1 through DELAY15) of the delay units 110a through 110o is indicated in Table 2 below.

TABLE 2

| DELAY 1 | DELAY 2 | DELAY 3 | DELAY 4 | DELAY 5 | DELAY 6 | DELAY 7 |
|---|---|---|---|---|---|---|
| 1 (CLK) | 2 (CLK) | 3 (CLK) | 4 (CLK) | 5 (CLK) | 6 (CLK) | 7 (CLK) |
| DELAY 8 | DELAY 9 | DELAY 10 | DELAY 11 | DELAY 12 | DELAY 13 | DELAY 14 |
| 8 (CLK) | 9 (CLK) | 10 (CLK) | 11 (CLK) | 12 (CLK) | 13 (CLK) | 14 (CLK) |
| DELAY 15 | | | | | | |
| 15 (CLK) | | | | | | |

Figure 5:
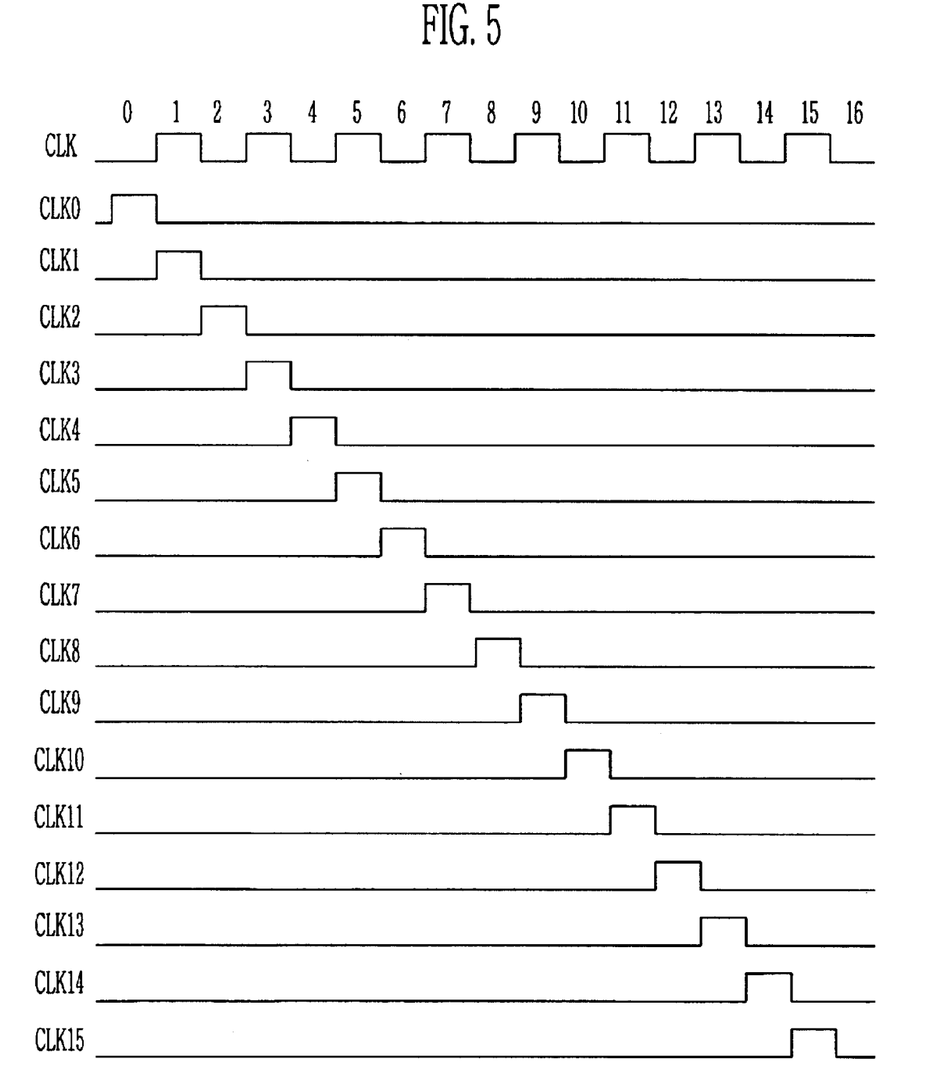
FIG. 5 shows a waveform of the clock signals of the clock generators shown in FIG. 1.

The clock generator 120 includes the plurality of the clock generators 120a through 120p so that they are one to one corresponding to the program data signals (D0 through D15). The first clock generator 120a of the clock generators 120a through 120p is synchronized to the program data signal (D0). Other clock generators 120b through 120p are synchronized by the delay signals (DELAY1 through DELAY15) outputted from the delay units 110a through 110o, respectively. Each of the clock generators 120a through 120p generates a clock having an approximate '10 ns' period. If the program data signal is a Low state only, the clock generators 120a through 120p generate the clocks. For example, if the values of the program data signals (D0 through D15) are '0000' (i.e., 0000, 0000, 0000, 0000, 0000), the waveform of each of the clock signals (CLK0 through CLK15) is shown in FIG. 5. Meanwhile, though each of the clock signals (CLK0 through CLK15) is synchronized to the falling edge of the pre-clock signal (for example, CLK0) to generate the clock signal, in FIG. 5, a subsequent clock signal (for example, CLK1) is not synchronized to the falling edge of the pre-clock signal and a subsequent clock signal is actually generated after a given time for the purpose of a logical sum at a subsequent logical combining unit 130.

The logical combining unit 130 includes an OR gate. The logical combining unit 130 logically sums each of the clock signals (CLK0 through CLK15) outputted from each of the clock generators 120a through 120p to produce a synchronizing clock signal (GCLK) for synchronizing each of the D-flip-flops D-FF, FF0 through D-FF7 constituting the program operation control unit 140. At this time, though it was described that the logical combining unit 130 includes only the OR gate, it should be noted that the logical combining unit 130 may include a combination of an AND gate, an NOR gate, an NAND gate and an inverter that can logically combine to generate the synchronizing clock signal (GCLK) if any one of the clock signals (CLK0 through CLK15) is outputted as a High state.

The counter 140 (hereinafter, called 'program operation control unit') is synchronized to the synchronizing clock signal (GCLK) from the logical combining unit 130 and includes the plurality (for example, 8 in number) of the D-flip-flops D-FF0 through D-FF7 serving as the shift registers. This is because the program operation is performed by dividing 16 bits into a High byte (H-byte) and a Low byte (L-byte) every 8 bits if the program operation is 16 bits. The program operation control unit 140 sequentially moves data (i.e., '1') inputted from the power supply terminal (Vcc) to a D terminal every time when the synchronizing clock signal (GCLK) is generated. This is indicated in Table 3 below.

TABLE 3

| GCLK | Q0 | Q1 | Q2 | Q3 | Q4 | Q5 | Q6 | Q7 |
|---|---|---|---|---|---|---|---|---|
| 0 | 0 | 0 | 0 | 0 | 0 | 0 | 0 | 0 |
| 1 | 1 | 0 | 0 | 0 | 0 | 0 | 0 | 0 |
| 2 | 1 | 1 | 0 | 0 | 0 | 0 | 0 | 0 |
| 3 | 1 | 1 | 1 | 0 | 0 | 0 | 0 | 0 |
| 4 | 1 | 1 | 1 | 1 | 0 | 0 | 0 | 0 |
| 5 | 1 | 1 | 1 | 1 | 1 | 0 | 0 | 0 |
| 6 | 1 | 1 | 1 | 1 | 1 | 1 | 0 | 0 |
| 7 | 1 | 1 | 1 | 1 | 1 | 1 | 1 | 1 |

Referring now to Table 3, the synchronizing clock signal (GCLK) is generated when any one of the clock signals (CLK0 through CLK15) outputted from the clock generators 120a through 120p is a High state (i.e., when a pulse is generated). Therefore, if any one of the clock signals (CLK0 through CLK15) is a High state, the synchronizing clock signal (GCLK) of a High state is generated and is then inputted of each of the D-flip-flops D-FF0 through D-FF7. Thereby, each of the D-flip-flops D-FF0 through D-FF7 is synchronized every time when the synchronizing clock signal (GCLK) of the High state is generated and thus moves data (i.e., '1') sequentially inputted to the D terminal from the D-FF0 to the D-FF7.

As shown in Table 3, if the output signal (Q7, overflow) of the D-flip-flop D-FF7 in the program operation control unit 140 is outputted as a High state (that is, when overflow is generated), it means that there exist over 8 program data signals (D0 through D15) being a Low state (i.e., performing the program operation) among the program data signals. In this case, the program operation is performed by dividing it into the High byte and the Low byte, similarly to the common method. However, if the output signal (Q7, overflow) of the D-flip-flop D-FF7 in the program operation control unit 140 is outputted as a Low state (that is, when overflow is not generated), it means that there exist less than 8 program data signals (D0 through D15) being a Low state (i.e., performing the program operation) among the program data signals. In this case, the program operation is not divided into the High byte and the Low byte but the program operation is performed at a time.

An operating characteristic of the bit counter described above will be explained in detail by reference to FIG. 3.

Figure 3:
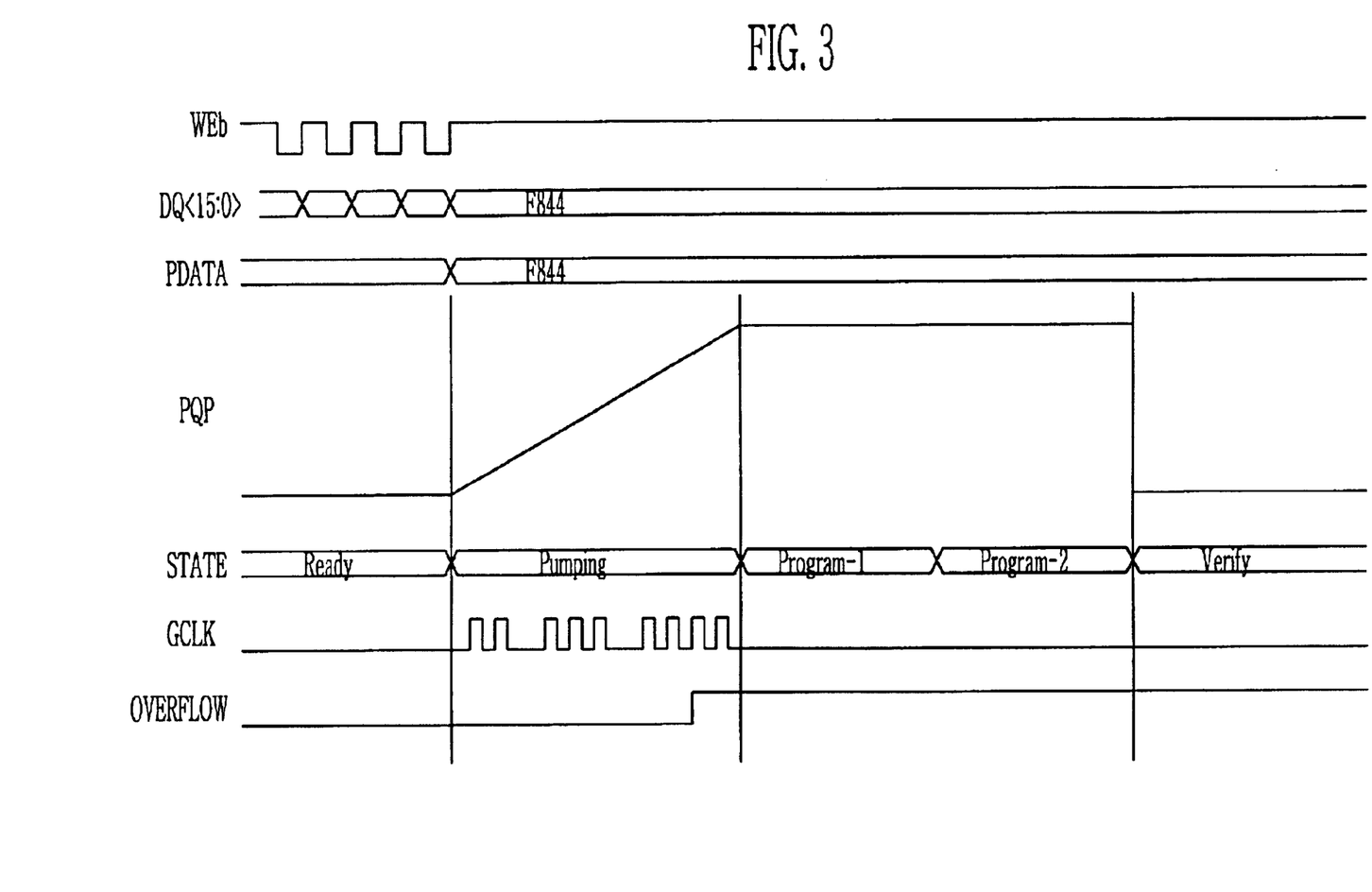
FIG. 3 shows an operating waveform of the bit counter shown in FIG. 2.
Figure 4:
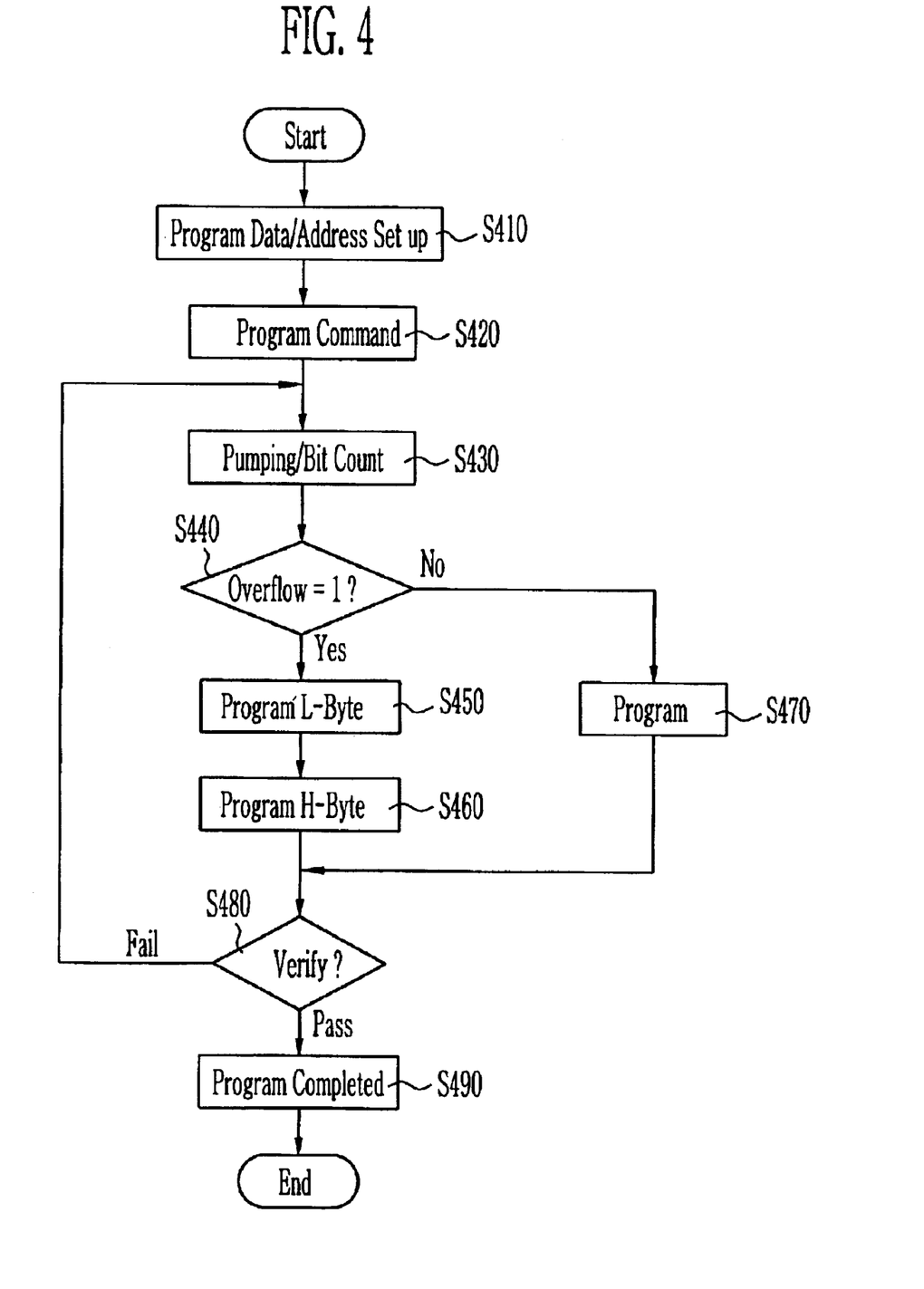
FIG. 4 is a flowchart for explaining a method of programming a semiconductor device using the bit counter shown in FIG. 2.

FIG. 3 shows an operating waveform of the bit counter shown in FIG. 2. For example, the waveforms show when the program data signals (D0 through D15) is 'F844' (i.e., 1111, 1000, 0100, 0100). FIG. 4 is a flowchart for explaining a method of programming a semiconductor device using the bit counter shown in FIG. 2;

Referring now to FIG. 3 and FIG. 4, at an initial read state, in order to perform the program operation, program data and address are set up (S410) and a program command is then inputted using a write enable bar signal (WEb) and a data queue (DQ) (S420).

In general, an internal state machine (not shown) for performing the program operation is synchronized the moment when the write enable bar signal (WEb) is shifted to a High state.

Meanwhile, the bit counter shown in FIG. 2 operates at a pumping period (i.e., an operating period of the pumping circuit) for generating the gate voltage and the drain voltage of the cell. For example, upon the program operation, the gate voltage (see 'PQP' waveform) of the cell usually requires 9V. Accordingly, in order to obtain a target gate voltage, the pumping period is inevitably required. Therefore, in the present invention, the bit counter is driven to count the bits to be programmed during the pumping period (generally, other circuits (not shown) are not driven) (S430).

During the step (S430), if the program data signals (D0 through D15) are inputted to the delay unit (see 119 in FIG. 1), the delay unit 110 delays the program data signals (D1 through D15) by one (1) clock, as shown in Table 2, to output the delayed signals to the clock generator (see 120 in FIG. 1). The clock generators 120 are then sequentially synchronized by the program data signals (D0 through D15) to produce the clock signals (CLK0 through CLK15). At this time, pulses are generated from only the clock signals (CLK0 and CLK1, CLK3 through CLK5, CLK7 through CLK10) of the clock signals (CLK0 through CLK15) outputted from the clock generator 120. This is because the pulses are generated through the clock generator 120 only when the program data signals are inputted as a Low state.

Next, the clock signals (CLK0 through CLK15) outputted from the clock generator 120 are inputted to the logical combining unit 130. Then, the logical combining unit 130 logically sums the clock signals (CLK0 through CLK15) to produce the synchronizing clock signal (GLK). At this time, nine synchronizing clock signals (GLK) of a High pulse (i.e., 0000, 0111, 1011, 1011) are outputted. Accordingly, the D-flip-flop D-FF7 of the program operation control unit (see 140 in FIG. 1) outputs an overflow of the High state.

In the step (S430), if an overflow is generated from the D-flip-flop D-FF7 of the program operation control unit 140 (S440), it means that there exist over 8 date of the program data signals (D0 through D15) for the program operation will be performed. In this case, the program operation is performed by dividing it into the Low byte (L-Byte; program-1) and the High byte (H-Byte; program-2) (S450 and S460). In the step (S430), however, if the overflow is not generated from the D-flip-flop D-FF7 of the program operation control unit 140 (S440), it means that less than 8 date of the program data signals (D0 through D15) for the program operation will be performed exist. In this case, the program operation is performed at a time (S470).

Next, the program operation for corresponding cells is performed and the program-verify step is performed for those cells. At this time, if there is a fail in those cells, the process returns to the step (S430) where a series of the program operations are repeatedly performed. If the cells are passed, the program operation is finished (S480 and S490).

As described above, in the present invention, only data signals to be programmed, of the program data signals, within the pumping period are counted using the bit counter. In other words, the clock signals (CLK0 through CLK15) outputted from the clock generator (see 120 in FIG. 1) have a period of 10 ns. Even though the program data signals transmitted from all the I/O terminals become 0000H (hexadecimal), the total period is about 10 ns×16=160 ns. Accordingly, as the pumping period is about 1 μs, the bit counting operation of the program data signals within the pumping period can be finished.

Further, as described above, if the program data signals (D0 through D15) are F844 (i.e., 1111, 1000, 0100, 0100), nine '0' of the data signals to be programmed exist. Accordingly, during the entire 160 ns period, nine synchronizing clock signals (GCLK) are generated. Thereby, the D-flip-flops D-FF0 through D-FF7 are sequentially moved nine times by the synchronizing clock signal (GCLK). In the eighth clock of the synchronizing clock signal (GCLK), an overflow is latched. Therefore, as the number of the bit of the data signals to be programmed is over 8 of 16, it is impossible to perform the program operation at a time using the common pump circuit (not shown) for generating the drain voltage that is designed to program eight data signals. Due to this, the program operation must be performed by dividing it into two operations. In other words, if an overflow is generated, the program operation is performed by dividing it into the two operations. On the contrary, if the number of the data signals to be programmed is not over 8, it is possible to simultaneously perform the program operation for all the bits (i.e., word unit) using the pumping circuit for generating the drain voltage since the overflow is not generated in the pumping period. Therefore, if the number of the program data signals to be programmed is less than 8, the program operation is not performed by dividing it into two operations but performed at a time, so that the total program operation time can be reduced. Also, the program operation time can be shorten even when the program operation is again performed if there is a fail after the verify operation.

As mentioned above, according to the present invention, upon the program operation, only the program data to be programmed among the program data are counted within the pumping period using the bit counter. Then, if the number of the data to be programmed is less than 8, the program operation is performed at a time in a word unit. Therefore, the present invention has an advantageous effect that it can shorten the program operation.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A bit counter, comprising:
   a plurality of clock generators corresponding to inputted program data, wherein the clock generators are synchronized to the program data to be programmed, of the program data, to generate different clock signals; and
   a counter synchronized to the clock signals outputted from the clock generators, for sequentially shifting the input data, upon synchronization, to count the number of bits of the program data to be programmed among the program data.

2. The bit counter as claimed in claim 1, further comprising a plurality of delay units corresponding to the program data so that the clock signals are not overlapped, and wherein the delay units delay the program data so that they have different amount and then input the delayed program data to the clock generator.

3. The bit counter as claimed in claim 1, wherein the period of the clock signal is about 10 ns.

4. The bit counter as claimed in claim 1, further comprising a logical combining unit for logically combining the clock signals outputted from the clock generators to produce a synchronizing output signal for synchronizing the counter.

5. The bit counter as claimed in claim 4, wherein the logical combining unit outputs a clock pulse of a High state if any one of the clock signals is outputted as a High state.

6. The bit counter as claimed in claim 1, wherein the counter includes a plurality of D-flip-flops that are synchronized to the clock signals.

7. The bit counter as claimed in claim 1, wherein the counter is synchronized to the clock signals and includes eight D-flip-flops that are serially connected one another.

8. A program circuit, comprising:
   I/O terminals for transmitting program data;
   the bit counter written in claim 1, for counting the number of bits of the program data to be programmed, among the program data transmitted from the I/O terminals; and
   a state machine for selecting a program operation in a word unit or a byte unit to perform the program operation, depending on the number of the bits counted by the bit counter.

9. The program circuit as claimed in claim 8, wherein the state machine performs the program operation twice by dividing the program operation into the byte units if the number of the bits is over 9.

10. The program circuit as claimed in claim 8, wherein the state machine performs the program operation at a time if the number of the bits is below 8.

11. A program method using the program circuit written in claim 8, comprising the steps of:
   (a) setting up program data and address and then inputting a program command, in order to perform a program operation;
   (b), counting the number of bits of the program data to be programmed, among the program data, within a pumping period where a program voltage is pumped, in order to perform the program operation; and
   (c) performing the program operation by selecting the program operation in a word unit or in a byte unit, depending on the number of the bit counted in the step (b).

12. The method as claimed in claim 11, wherein in the step (c), the program operation is performed twice by dividing the program operation into the byte units if the number of the bits is at least 9 or more.

13. The method as claimed in claim 11, wherein in the step (c), the program operation is performed at a time if the number of the bits is below 8.

14. The method as claimed in claim 11, further comprising the step of performing a program-verify step after the (c) step.

* * * * *